United States Patent [19]

Narozny

[11] Patent Number: 4,469,388
[45] Date of Patent: Sep. 4, 1984

[54] HEADER FOR IMPOSING FRICTIONAL FORCE ON TERMINAL POSTS

[75] Inventor: Ronald S. Narozny, Panorama City, Calif.

[73] Assignee: Thomas & Betts Corporation, Raritan, N.J.

[21] Appl. No.: 287,301

[22] Filed: Jul. 27, 1981

[51] Int. Cl.³ .................... H01R 9/09; H01R 13/629
[52] U.S. Cl. .......................... 339/45 M; 339/91 R
[58] Field of Search .......... 339/45 R, 45 M, 75 M, 339/91 R, 217 R, 221 R, 221 M

[56] References Cited

U.S. PATENT DOCUMENTS

| | | | |
|---|---|---|---|
| 3,579,283 | 5/1971 | Welburn | 339/217 R |
| 3,750,086 | 7/1973 | Iversen | 339/75 M |
| 4,006,957 | 2/1977 | Narozny | 339/103 M |
| 4,057,879 | 11/1977 | Eigenbrode | 24/230 |
| 4,070,081 | 1/1978 | Takahashi | 339/91 |
| 4,105,275 | 8/1978 | Dixon et al. | 339/91 |
| 4,152,038 | 5/1979 | Inouye et al. | 339/75 |
| 4,178,051 | 12/1979 | Kocher et al. | 339/45 |
| 4,189,199 | 2/1980 | Grau | 339/91 R |
| 4,193,656 | 3/1980 | Ward | 339/45 M |
| 4,232,926 | 11/1980 | Inouye et al. | 339/45 |
| 4,299,432 | 11/1981 | Grau | 339/75 M |
| 4,319,797 | 3/1982 | Otani et al. | 339/217 R |

FOREIGN PATENT DOCUMENTS

| | | | |
|---|---|---|---|
| 2707122 | 9/1977 | Fed. Rep. of Germany | 339/75 M |
| 722644 | 1/1955 | United Kingdom | 339/31 M |

OTHER PUBLICATIONS

Scotchflex® Backplane Socket/Header System–3M, p. 22.

Primary Examiner—John McQuade
Assistant Examiner—Gary F. Paumen
Attorney, Agent, or Firm—Robert M. Rodrick; Salvatore J. Abbruzzese

[57] ABSTRACT

A header for self-securement to terminal posts extending from a printed circuit board (PCB) includes a member selectively movable into frictional engagement with terminal posts to provide for an increase in retention force as between the header and PCB independently of the force established for insertion of the header upon the terminal posts.

9 Claims, 5 Drawing Figures

HEADER FOR IMPOSING FRICTIONAL FORCE ON TERMINAL POSTS

FIELD OF THE INVENTION

This invention relates to electrical connectors and pertains more particularly to headers providing for the interconnection of female sockets to terminal posts on substrates, such as a printed circuit board (PCB).

BACKGROUND OF THE INVENTION

In the field of back panel wiring, it is typical that the computer frame manufacturer makes available, for interconnect purposes, a matrix of terminal posts or pins supported by and electrically connected to a computer input/output (I/O) PCB. The user is thereby given several options to interconnect his system to the computer, e.g., so-called wire/wrap connection, discrete wire soldering, press-fit of female connectors thereon, etc. In the last-mentioned option, the user typically enshrouds a selected array of the posts with a header which is designed, on the one hand, to frictionally receive the posts to obtain self-securement of the header to the PCB and, on the other hand, to guide the female connector into properly polarized relation with the post array such that individual female connector sockets register with individual posts of the array and resiliently electrically engage same.

Two interdependent force relationships attend the self-securement of headers to PCBs, namely, insertion force and withdrawal force. Desirably, insertion force, i.e., the force needed to apply the header to the posts, would be low for post and PCB protection and for assembler convenience. Conversely, relatively high withdrawal force is desired to insure that the header maintain its assembled relation with the PCB and not be accidentally displaced. Considering, for example, a ten-post array arranged with two rows of five posts, a thirty-five-pound header withdrawal force is typically desired. On the other hand, the per post header insertion force should typically not exceed one and seven-tenths pounds, lest the posts be pushed out of retention in the PCB. The insertion force criterion of seventeen pounds total gives rise to a disparity of eighteen pounds between the respective desired insertion and withdrawal forces. Further, the withdrawal force decreases on cycling since the header channels for frictional receipt of the posts become enlarged and afford less retentive force.

One known practice for compensating for the disparity noted above as between insertion and withdrawal forces and for providing constancy of withdrawal force over cycling has been to introduce metal spring clips in retaining relation to the posts within the header. However, this practice not only increases costs of header manufacture but also can give rise to electrical shorting problems if the clips become dislodged within the header.

Presently known headers also include retainers to secure connectors therein, customary retainers being in the form of members supported by the header for movement into such position as to block egress of the connector from the header. Some headers arrange these retaining members such that they function as above in one sense of movement but also serve the function of ejecting the connector from the header upon opposite sense movement in the header.

As headers are presently known in the art, they are deemed to have shortcomings in respect of the interdependence of insertion and withdrawal forces, absent such interior metal spring clips, and in requiring fully separate structure for the functions of header securement to the PCB, of connector retention and of connector ejection.

SUMMARY OF THE INVENTION

The present invention has as its primary object the provision of improved headers for interconnection of electrical apparatus with terminal posts.

A more particular object of the invention is to provide header structure wherein withdrawal force can conveniently be increased independently of insertion force.

In attaining the foregoing and other objects, the invention provides a header wherein frictional force can be applied selectively to terminal posts subsequent to insertion of the posts within the header, thus providing for any desired increase in withdrawal force independently of theretofore established insertion force.

In the particularly preferred embodiment of the header of the invention, as applied to a ten-post array, header outboard channels for receiving the outboard posts of the array are configured differently from the remainder of the post-receiving channels, i.e., to impose little or no friction upon posts during receipt thereof. The header includes members supported for selective movement therein into frictional restraint with the outboard posts following insertion thereof in the outboard channels. Insertion force is thus established by friction-imposing inboard channels. Withdrawal force is then the composite of such insertion force and the frictional forces imposed on the outboard posts by such movable header members. The outboard post frictional force may, as discussed hereinafter, be established to fully compensate for the prior art disparity as between desired insertion and withdrawal forces.

As will also be seen below, the invention so arranges the members movable into engagement with the outboard posts that common structure, i.e., the structure of the selectively movable members themselves, accommodates the additional header functions of connector retention and ejection.

The foregoing and other features of the invention will be further evident from the following detailed description of such preferred embodiment and from the drawings wherein like reference numerals are used throughout to identify like parts.

Figure 1:
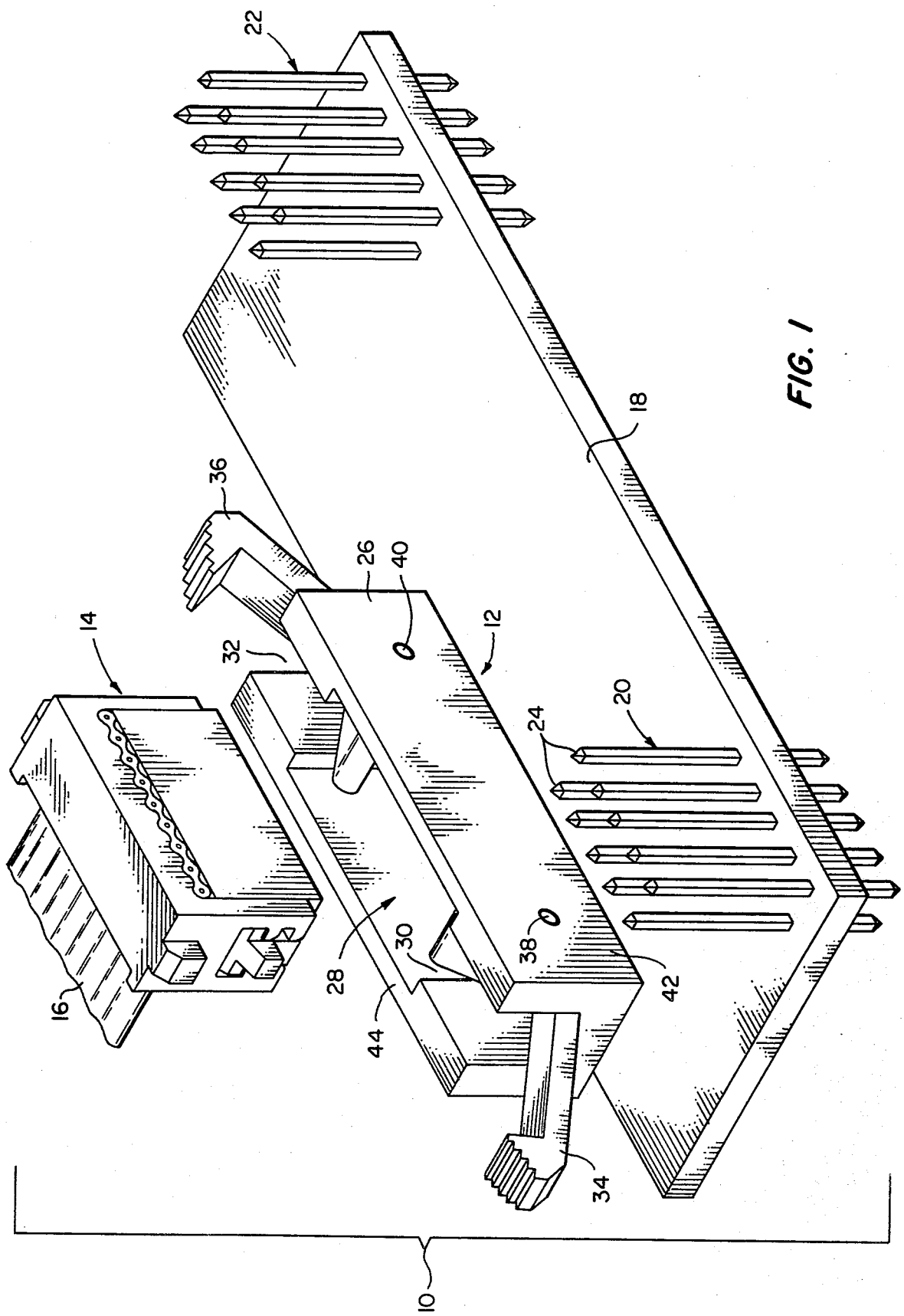
FIG. 1 is a perspective view showing a header in accordance with the invention in unassembled relation with a female connector terminating a ribbon cable and with a PCB supporting a terminal post matrix including plural post arrays.

DESCRIPTION OF THE PREFERRED EMBODIMENTS:

Referring to FIG. 1, header interconnect assembly 10 is shown in exploded manner, header 12 of the invention being centrally disposed between female connector 14, which terminates flat multiconductor cable 16, and PCB 18, which supports a terminal post matrix, inclusive of two post arrays 20 and 22, each including for purposes of example ten terminal posts 24. Connector 14 may be of any known variety for receiving posts 24, e.g., of type having electrical contacts with insulation-piercing end portions engaging the conductors of cable 16 and socket portions accessible exteriorly of the bottom of the connector for receiving terminal posts 24 to resiliently electrically engage the posts, as shown in U.S. Pat. No. 4,006,957 issued to Narozny on Feb. 8, 1977 and commonly assigned with the subject application. PCB 18 with typical arrays 20 and 22 will further be recognized as showing a customary back panel of a computer main frame or like device to which it is desired to electrically interconnect the conductors of cable 16.

Header 12 includes a housing 26, formed of an electrically insulative material, typically a molded body of plastic. Housing 26 is shown upstanding and has openings in its top surface leading into central recess 28, for receipt of connector 14, and sideward thereof leading into outboard recesses 30 and 32. Arm-like members 34 and 36 are disposed in recesses 30 and 32, respectively supported for rotative movement by pivot pins 38 and 40. In assembly of header 12, members 34 and 36 may be inserted in recesses 30 and 32 and the pivot pins inserted through openings in front wall 42, then through openings in members 34 and 36 and then into openings formed in rear wall 44.

Figure 4:
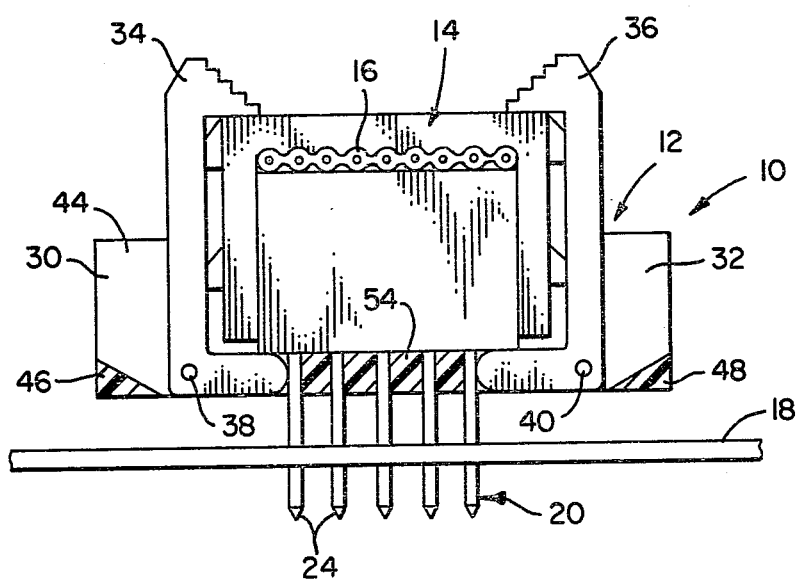
FIG. 4 is a sectional view of the FIG. 3 header as seen from plane IV—IV of FIG. 3, with members 34 and 36 shown in positions providing for header self-securement to PCB 18 and with the female connector shown in general outline form for clarity.
Figure 3:
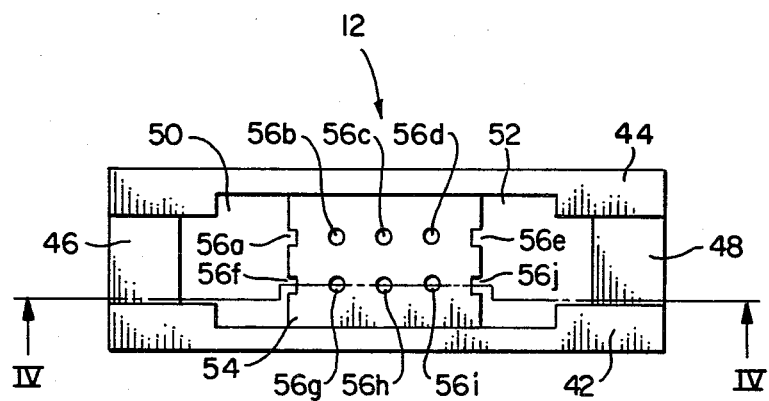
FIG. 3 is a top plan view of the header of FIGS. 1 and 2, with members 34 and 36 and pivot pins 38 and 40 omitted for clarity.

Referring to FIGS. 3 and 4, further structural detail of header 12 may be seen. Thus, at the bottoms of recesses 30 and 32, header 12 defines wedge-shaped sideward base portions 46 and 48. The header base includes bottom-open areas 50 and 52 extending inboard of base portions 46 and 48, respectively, to central base portion 54. Channels 56a through 56j are formed in base portion 54 in an array corresponding to the array of terminal posts upon which the header is to be mounted and self-secured, i.e., in the illustrative ten post example, channels 56a–56e are in one row and channels 56f–56j are in another row. For reference purposes, channels 56a, 56e, 56f and 56j will be termed outboard channels since they are found at the sides of base portion 54. Channels other than the outboard channels, i.e., inboard channels 56b–56d and 56g–56i, are of first configuration, which is of type fully perimetrically bounded by housing 26, such that these channels perform the customary application of frictional restraint force to posts entering same, to effect self-securement of the header to the posts and hence to the PCB supporting the posts in fixed array.

In accordance with the presently discussed preferred embodiment of the header of the invention, the outboard channels are of second configuration which is of type partially perimetrically bounded by housing 26, such that the outboard channels do not apply such customary frictional restraint to posts entering same. In FIG. 3, the outboard channels preferably have open square configuration, which may otherwise be open semi-circular or other suitable geometric configuration. Conversely, the inboard channels will be seen to be preferably of complete circular configuration within housing 26.

Given the exemplary parameters above discussed for maximum acceptable force per post during insertion, i.e., one and seven-tenths pounds per post, and considering that there are a total of six channels of customary configuration, it will be appreciated that the insertion force at hand is ten and two-tenths pounds. This measure will also be seen to be the withdrawal force established to this juncture.

Figure 5:
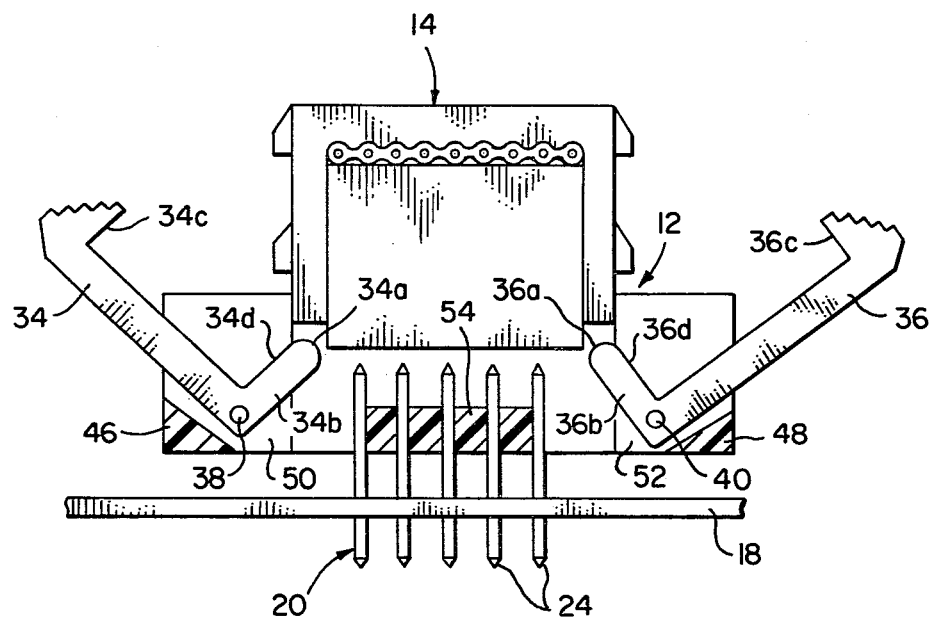
FIG. 5 is a repetition of the FIG. 4 showing, but with members 34 and 36 in positions providing for connector ejection from the header.

Turning now to the showing of members 34 and 36 in FIG. 5, each defines a primary operative surface at 34a and 36a, such surface 34a being capable of furnishing partial bounding surface to outboard channels 56a and 56f and such surface 36a being capable of furnishing partial bounding surface to outboard channels 56e and 56j, upon movement of members 34 and 36 from their FIG. 5 positions to their FIG. 4 positions. The length of each of leg parts 34b and 36b of members 34 and 36 is selected such that these parts abut, through their surfaces 34a and 36a, terminal posts resident in the outboard channels and frictionally engage same, such posts projecting outwardly from the channels 56a, 56f, 56e and 56j beyond the side edges of the base portion 54. In the illustrative example, it will be recalled that one desires an insertion force not greater than one and seven-tenths per pin and wishes that the withdrawal force amount to at least thirty-five pounds. If one assigns a frictional restraint force of six and two-tenths pounds per post to the four outboard posts, through appropriate selection of lengths of leg parts of members 34 and 36 and materials constituting surfaces 34a and 36a, the header under discussion provides such thirty-five pounds, comprised of twenty-four and eight-tenths pounds afforded by members 34 and 36 and ten and two-tenths pounds afforded by the inboard channels of housing 26.

In providing such supplemental withdrawal force, members 34 and 36 are selectively movable into interference registry with outboard posts, i.e., the members provide additional perimetric boundary for the outboard channels to the boundary provided the outboard channels by housing 26. Other measures may be taken to realize such increase of withdrawal force with respect to insertion force. For example, in another embodiment, all post-receiving channels may be of common perimetric configuration, such as a fully cylindrical or square channel in housing 26. The cumulative frictional force arising from the posts and channels is, again, the insertion force and a component of the withdrawal force. The remaining component of withdrawal force may be provided by selective movement of members into frictional engagement with one or more of the received posts at a location on the post distal from its receipt channel, e.g., between the header and the PCB or between the connector and header base.

Figure 2:
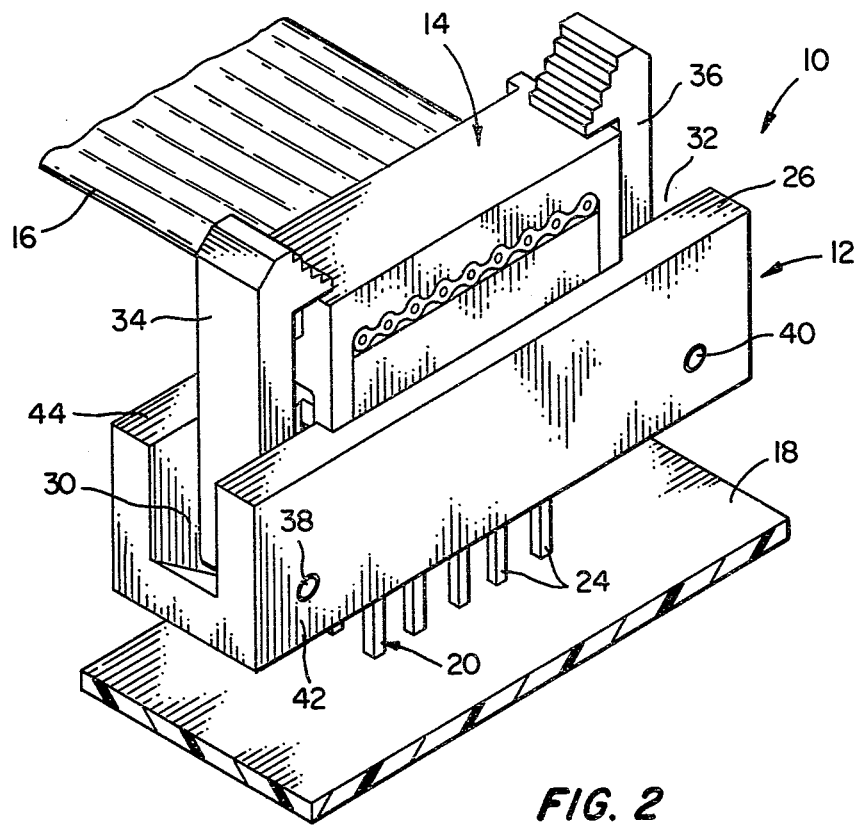
FIG. 2 is a perspective view showing the FIG. 1 header mounted upon one of the post arrays and assembled further with the female connector.

Referring again to FIG. 5, members 34 and 36 define secondary operative surfaces at 34c and 36c and at 34d and 36d, respectively capable of retaining the connector assembled with the header, as in FIGS. 2 and 4, and of ejecting the connector from assembled relation with the header. In the course of clockwise (first sense) movement of member 34 from its FIG. 5 position, the member realizes its above-noted withdrawal force supplemental relation with posts in channels 56a and 56e, and also realizes connector retention by disposition of its surface 34c in the path of egress of the connector from the header. Upon counterclockwise (second sense) movement of member 34 from its FIGS. 2/4 position, surface 34d thereof is moved into ejecting disposition with respect to the connector. The header remains in self-securement to the PCB during ejection of the connector, based on the continuing component of retentive force provided by the inboard channels.

Various modifications to the depicted and discussed embodiments will now be evident to those skilled in the art and may be introduced without departing from the invention. In addition to alternatives above discussed, one may select one or more channels in lieu of the outboard channels for use in segregating withdrawal force in part from insertion force and may wish to attain this function by selective movement other than the preferred rotative sense movements. The particularly disclosed and discussed embodiments are thus intended in an illustrative and not in a limiting sense. The true spirit and scope of the invention are set forth in the following claims.

What is claimed is:

1. A header for receiving an array of terminal posts and effecting self-securement thereto comprising:
an insulative housing comprising:
a body portion including thereon a plurality of post receiving channels being configured to removably receive said posts, said body portion adapted for receipt of an electrical connector; and
a movable housing member secured to said body portion for providing retentive engagement of said electrical connector and for selective movement into direct frictional engagement with at least one of the posts received by said header whereby said header exhibits a withdrawal force from such self-securement to said posts in excess of force required for insertion of said posts therein.

2. The header claimed in claim 1 wherein said post receiving channels are provided in respectively differently configured first and second types, such movable housing member being supported on said body portion for selective movement into interference registry with such second type channel.

3. The header claimed in claim 2 wherein such first type channel is fully perimetrically bounded by said body portion and wherein said second type channel is bounded jointly by said body portion and said movable housing member upon such movement thereof into interference registry with said second type channel.

4. The header claimed in claim 3 wherein said body portion is an upstanding element defining vertical partially circumscribing boundary for said second type channel, said movable housing member defining further vertical partially circumscribing boundary for said second type channel upon such movement thereof into interference registry with said second type channel.

5. The header claimed in claim 4 wherein said movable housing member is supported for rotative movement on said body portion.

6. The header claimed in claim 1 wherein said body portion defines a recess for receipt of a said connector for further receipt of said posts.

7. The header claimed in claim 6 wherein said movable housing member defines surface for retaining said connector in said housing upon such movement of said movable housing member into frictional engagement with such post.

8. The header claimed in claim 7 wherein said movable housing member defines further surface for ejecting said connector from said housing upon movement of said movable housing member out of such frictional engagement with such post.

9. The header claimed in claim 1 wherein a first set of channels of said body portion boundingly receives posts of said array and at least one channel of said body portion non-frictionally receives at least one post of said array.

* * * * *